United States Patent [19]
Lagnado et al.

[11] 3,940,602
[45] Feb. 24, 1976

[54] SIGNAL PROCESSING IMAGER ARRAY USING CHARGE TRANSFER CONCEPTS

[75] Inventors: Isaac Lagnado; Harper J. Whitehouse, both of San Diego, Calif.

[73] Assignee: The United States of America as represented by the Secretary of the Navy, Washington, D.C.

[22] Filed: Sept. 23, 1974

[21] Appl. No.: 508,472

[52] U.S. Cl............... 235/181; 178/7.1; 307/221 C; 357/24; 357/30
[51] Int. Cl.[2] ..................... G06G 7/19; H01L 31/00
[58] Field of Search...................... 235/181, 150.51; 307/221 C, 221 D, 304; 178/7.1; 357/24, 30

[56] References Cited
UNITED STATES PATENTS

| | | | |
|---|---|---|---|
| 3,621,221 | 11/1971 | Cann................................... | 235/181 |
| 3,809,923 | 5/1974 | Esser................................ | 307/221 D |
| 3,819,953 | 6/1974 | Puckette et al................. | 307/221 D |
| R27,951 | 3/1974 | Teer et al. ........................... | 178/7.1 |

OTHER PUBLICATIONS

Garner: State of Solid State: Radio–Electronics, Aug. 1973, pp. 57–58.

Collins et al.: Analog Matched Filters Using Charge Coupled Devices, NEREM Record 1972, pp. 185–187.

Amelio: Charge Coupled Devices, Scientific American, Vol. 230, No. 2, Feb. 1974, pp. 22–31.

Carnes et al.: Sensitivity and Resolution of Charge-Coupled Imagers at Low Light Levels, RCA Review, Vol. 33, Dec. 1972, pp. 607–622.

*Primary Examiner*—Felix D. Gruber
*Attorney, Agent, or Firm*—R. S. Sciascia; G. J. Rubens; H. Fendelman

[57] ABSTRACT

A signal processing sensor which utilizes a combination of charge transfer devices and signal processing concepts which simultaneously measures the incident optical signal and performs a linear transformation upon that signal. Two CCD registers are arranged on either side of a photodiode array. Independent control of the transfer gates which control the flow of information stored in the depletion region of the photodiodes results in independent functioning of the two CCD registers. The difference between the charge in the two registers is taken at the output in order to provide both positive and negative weight for the data pattern that is to be convolved or correlated.

9 Claims, 10 Drawing Figures

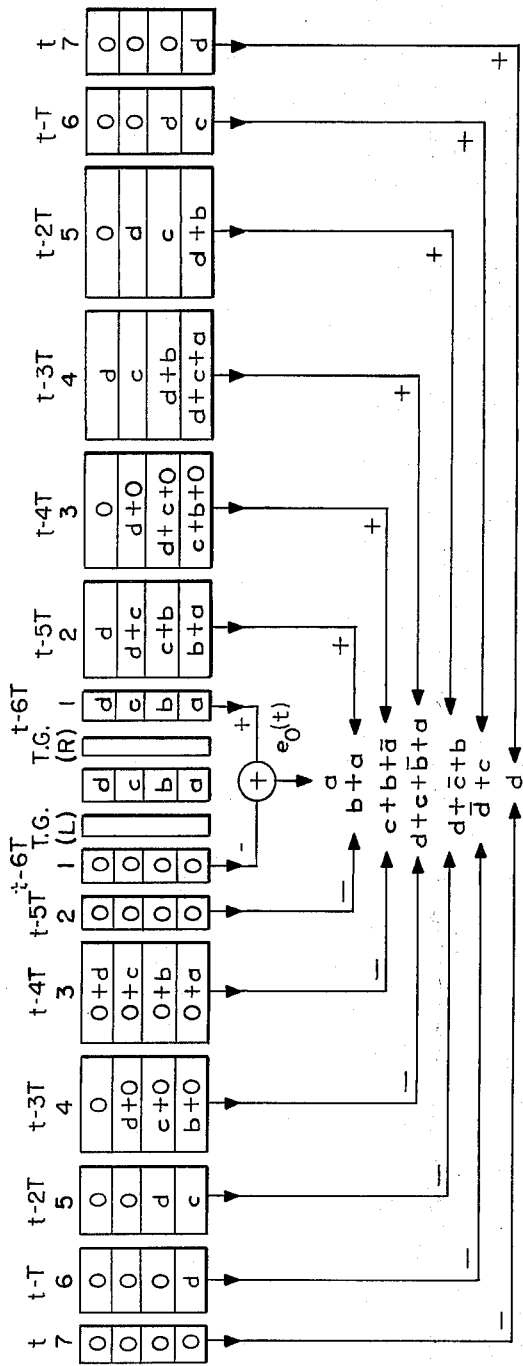
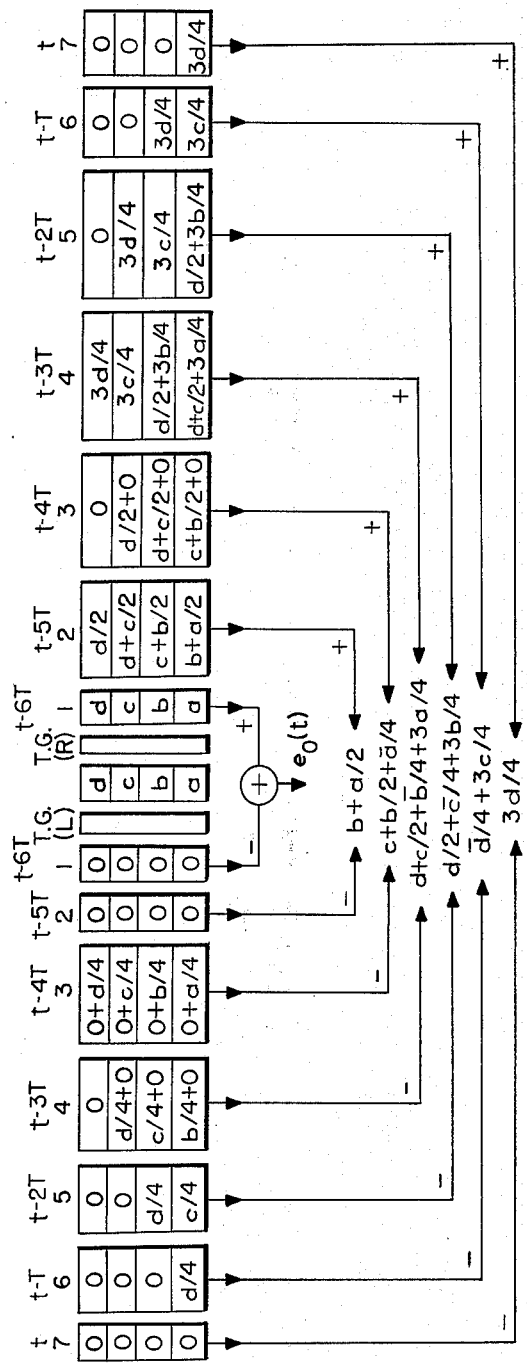
FIG.4a                    FIG.4b

SIGNAL PROCESSING IMAGER ARRAY USING CHARGE TRANSFER CONCEPTS

BACKGROUND OF THE INVENTION

One-dimensional linear transformations and filters for electronic signals are commonly employed in communications systems. There is presently an interest in applying two-dimensional linear transformations and filters to optical systems, such as television. The usual approach is to scan the image with an image sensor and then to apply the transformation or filter to the resulting electronic signals. However, if a two-dimensional transformation or filter is required, then the individual lines of the image must first be processed one at a time, the intermediate computation stored in a memory which is read out in transposed order and then the transposed signal is further processed, a column at a time, to achieve the final two-dimensional transformation. Unfortunately, the size of the memory necessary to store the intermediate computations for this two-step processing exceeds a quarter million words for a single monochrome television image. Thus, many applications of two-dimensional filtering cannot be applied in real time because of the lack of the transpose memory required for the intermediate computations.

SUMMARY OF THE INVENTION

According to the present invention a new optical sensor is provided which combines the functions of signal processing and image sensing in a single photosensitive Charge Coupled Device (CCD). For simplicity of description a one-dimensional signal processing sensor is described.

In many of the CCD image sensors there are two separate areas. One is for the integration of the photogenerated charge and the other is for temporary storage during read-out. According to prior art techniques the sensor is operated in such a manner that the transition of the charge from one area to the other is made rapidly so that there will be negligible "smear" due to photogenerated charges produced during the vertical shift or transfer. However, "smear" is just another name for convolution and convolution is the fundamental operation of linear filtering. The technique and apparatus of the present invention utilizes and controls the smear so that the vertical filtering can be accomplished during the photocharge integration and vertical shift.

The device of the present invention simultaneously controls the amount of photogenerated charge and its transverse transfer to dual CCD shift registers. Successive iteration of the charge generation and transfer correspond to a weighted superposition of lagged versions of the image and thus corresponds to a discrete convolution of the image as sampled by the spacial structure of the sensor with the time function represented by the transfer signal. Thus, the single structure device of the present invention combines the functions of image sensing, spacial to temporal multiplexing, and convolution or correlation.

STATEMENT OF THE OBJECTS OF THE INVENTION

It is an object of the present invention to integrate in a single device both concepts of charge coupling and signal processing to simultaneously measure the optically incident signal and perform a linear mathematical transformation upon that signal.

It is another object of the present invention to provide a novel CCD imager.

It is a still further object of this invention to provide a quantitative and efficient technique for computing the convolution or correlation functions.

Other objects, advantages and novel features of the invention will become apparent from the following detailed description of the invention when considered in conjunction with the accompanying drawings.

BRIEF DESCRIPTION OF THE DRAWINGS

FIG. 4a is an illustration of the operation of the device in accordance with a weighting sequence consisting of 1's.

FIG. 4b is an illustration of the operation of the device with a weighting sequence consisting of fractions.

FIGS. 5a and 5b are illustrations of the relative output versus time produced by the device in accordance with the operation illustrated in FIG. 4a.

DESCRIPTION OF THE PREFERRED EMBODIMENTS

Figure 1:
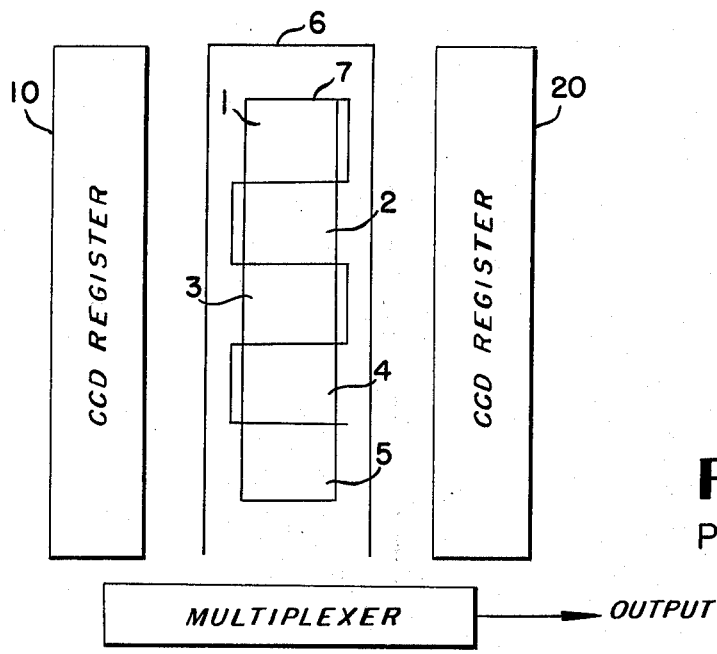
FIG. 1 is a schematic diagram of a prior art CCD linear imaging device.

The convolution of two discrete signals f and g can be expressed as $$[f * g]_n = \sum_K f_n g_{n-K} \qquad (1)$$

and the correlation of two discrete signals f and g can be expressed as $$[f * g]_n = \sum_K f_n g_{n+K} \qquad (2)$$

Under this definition of convolution, the smear that occurs in the CCD imager during the transition from the integrating area to the storage is the convolution of the image with a rectangular positive pulse of duration equal the number of vertical lines in the image. This convolved or smeared image is superposed on the desired image and has a relative magnitide proportional to the ratio of the time of image integration to image translation. The present invention uses this intrinsic convolution providing useful filtering thus permitting the translation time to be made long, effectuating high charge transfer efficiency and minimizing power dissipation.

To make the concept of convolution general, multiplication by negative numbers is required. Since only positive quantities of charge can be stored in the potential wells of a CCD sensor, time or space multiplexing must be used as is illustrated in the prior art diagram of FIG. 1. According to the prior art design, photosensors 1, 2, 3, 4 and 5 store the charges representative of an image. The elements necessary for multiplication by negative numbers are provided, but the configuration of the transfer gate 6 and the diffusion stops 7 prevent bidirectional transfer of the signal from each integrating sensor to both CCD shift registers 10 and 20.

Figure 2:
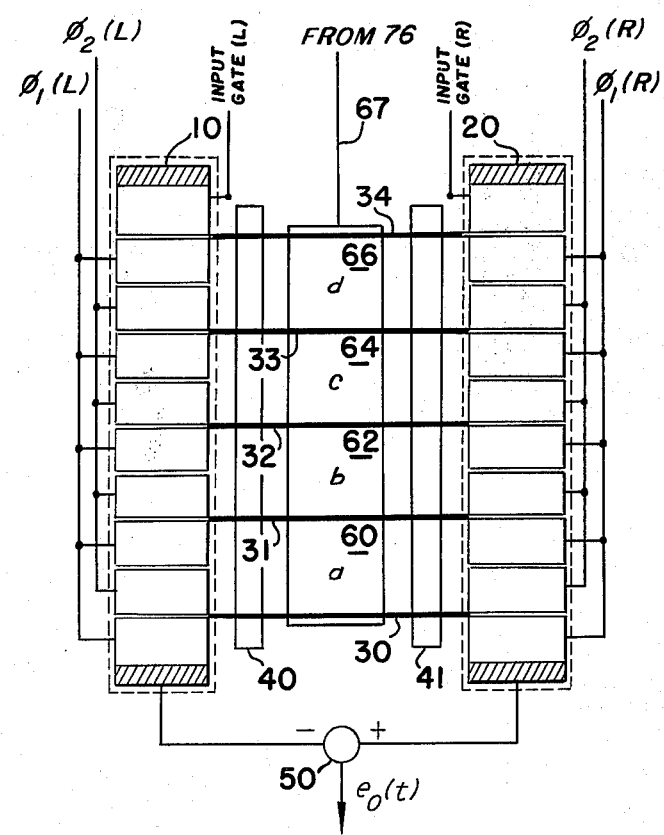
FIG. 2 is a schematic diagram of a novel CCD imager according to the present invention.
Figure 3:
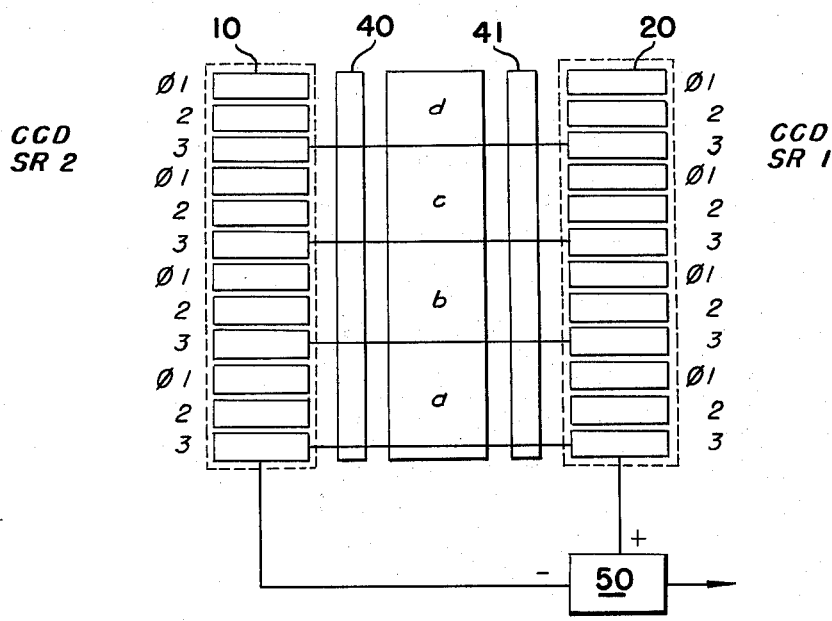
FIG. 3 is a schematic diagram of a novel three phase CCD imaging device according to the present invention.

According to the present invention, two important modifications to the basic structure of the linear CCD imaging device illustrated in FIG. 1 have been made to provide the operations necessary for use as a convolver/correlator. As illustrated in FIG. 2, diffusion stops 30, 31, 32, 33 and 34 are arranged to permit bidirectional transfer of the charge signals $a$, $b$, $c$ and $d$ obtained from a light source (not shown) to either the left CCD shift register 10 or the right CCD shift register 20 indicated by the dotted lines. Left transfer gate 40 and right transfer gate 41 are also provided to implement independent control of the charge transfer. FIG. 2 illustrates an embodiment of the present invention utilizing two phase CCD shift registers. For simplicity each register is illustrated as comprising four bits with two phase electrodes for each bit. Of course any number of bits could be used. Alternatively, three phase CCD shift registers as illustrated in FIG. 3 or single phase CCD shift registers (not shown) could be used. The output of CCD register 10 is subtracted from the output of CCD register 20 by means of adder 50 which may, for example, comprise a series connection of a differential preamplifier, a video driver and demultiplexer, and a differential output amplifier (not shown). With the embodiment illustrated in FIG. 2, positive products can be stored in the right register and negative products can be stored in the left register. After each shift cycle of the vertical registers, additional positive or negative products are stored in the appropriate registers. Thus, the sum of positive lagged products accumulate in the right register 20 and the sum of negative lagged products accumulate in the left register 10. The difference between these accumulated charges is formed by adder 50 thus providing the convolution of the positive image represented by charge signals $a$, $b$, $c$ and $d$ stored in optical sensors 60, 62, 64 and 66, respectively, with a sequence of both positive and negative numbers. The optical sensors may, for example, be photodiodes or photosensitive MOS capacitors.

When an image is projected on the sensing elements 60, 62, 64 and 66, electron-hole pairs are generated. The electrons (in a p-semiconductor substrate) will be normally grouped within a diffusion length from their generation sites in the depletion regions formed under the photogates. By independently adjusting the surface potential under the transfer gates, the present invention enables selective transfer of the stored charges from under the photosensors into the desired CCD register for subsequent mathematical operation. By controlled energization of the photogate electrode 67, charges representative of a sequence of 1's, fractions, or combinations thereof may be accumulated and subsequently transferred.

The implementation of a discrete convolution will now be described in detail. The two sequences can be easily represented as the input signal $e_i(t)$ in the form of charge packets generated and stored under each sensing element and as a digital pattern of narrow pulses $W_k$ applied to the transfer gates. The convolution of these two functions or sequences yields a third function which is mathematically described as the superposition of the effect of past input excitations to account for the present output. If one assumes that the device under consideration has not reached saturation, i.e., the different potential wells are not completely filled, the output is expressed directly in terms of an explicit summing operation upon the input. Thus, the present value of the output is a weighted sum over the history of the input $e_i(t)$. The explicit input-output relationship is $$e_O(t) = \sum_{K=0}^{N} W_K e_i(t - KT) \qquad (3)$$

where $W_K$ is the weighting function associated with the $K^{th}$ position of the pulse in the timing sequence. In the present case, the weight $W_K$ are treated as positive or negative binary numbers. The output is thus a weighted sum of the image samples with positive or negative coefficients.

Figure 5A:
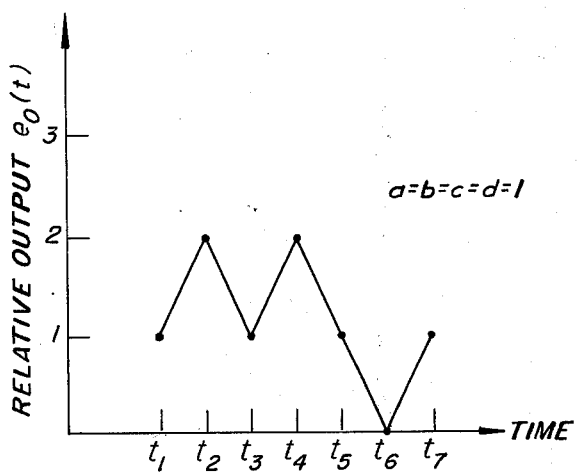
Figure 5B:
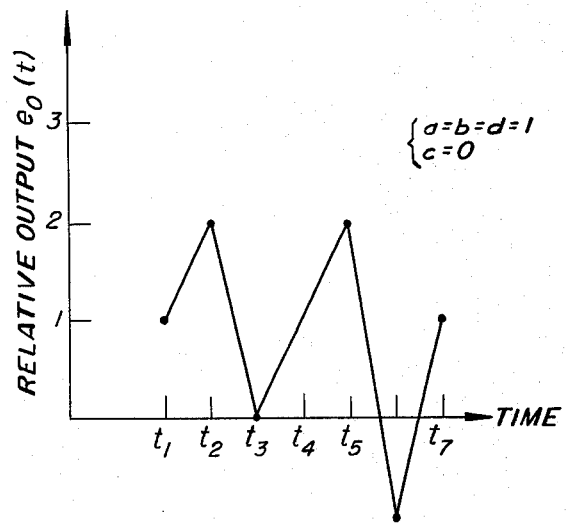
Figure 6:
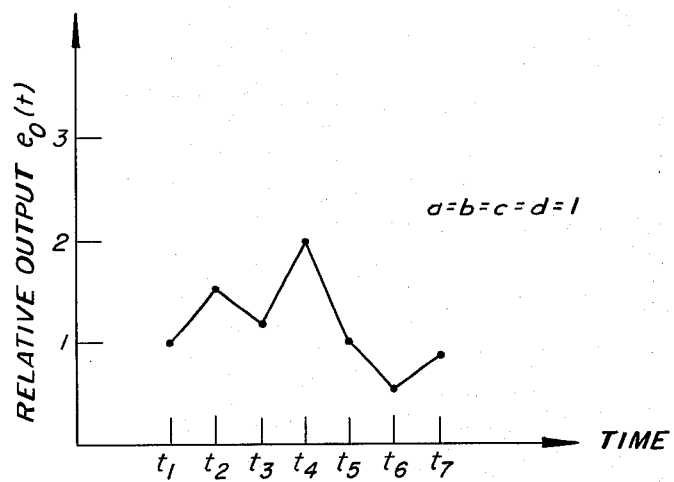
FIG. 6 is an illustration if the relative output versus time of the device in accordance with the operation illustrated in FIG. 4b.
Figure 7:
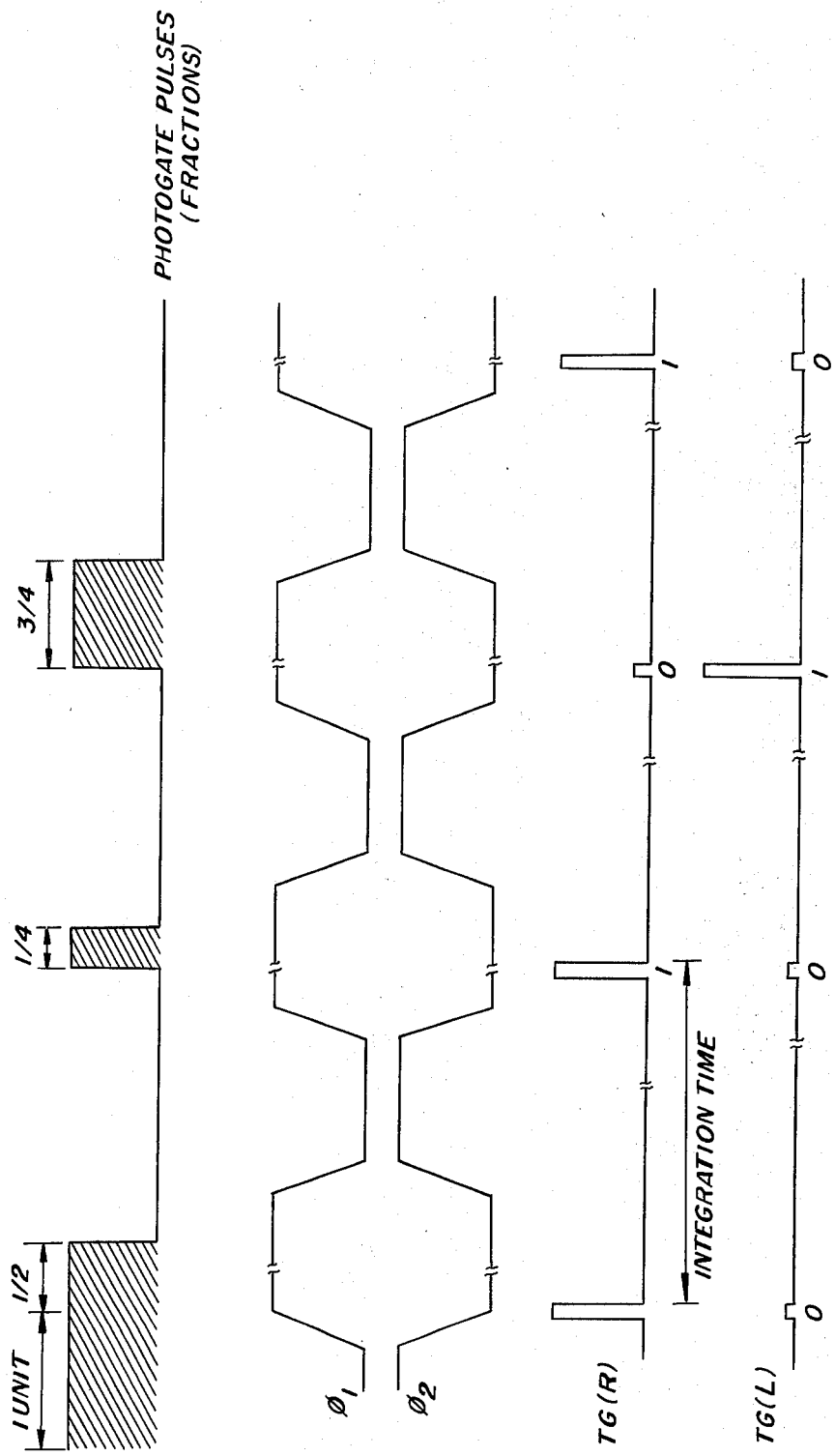
FIG. 7 is an illustration of the timing relationship between the clock phase and transfer gate pulses for the operation illustrated in FIGS. 4a and 4b.

The device of FIG. 2 provides an output signal $e_O(t)$ that is the product of the sensing element signal and a parameter set by the digital timing sequence applied to the transfer gates and the photogate and is algebraically summed at the output of the CCD shift registers 10 and 20 to account for past excitations. The convolution operation is thus seen to result from a series of shifting, multiplication by a weighted constant and summation. The four image representative charge signals $a$, $b$, $c$ and $d$ which constitute the input signal $e_i(t)$ illuminate four adjacent photogates as depicted in FIG. 4a. The result of applying the weighting sequence $W_K$ described by the digital pattern 1, 1, −1, 1 is illustrated in FIG. 4a. The relative output versus time for the convolution operation illustrated in FIG. 4a is illustrated in FIGS. 5a and 5b. The weighting sequence is decomposed into two timing sequences to be applied appropriately to the left and right transfer gates 40 and 41 respectively. The timing relationship between the clock phase pulses $\phi 1$ and $\phi 2$ and the transfer gate pulses for this example are illustrated in FIG. 7. For a weighting sequence consisting solely of 1's, as in FIG. 4a, the photogate would remain open for the duration of the sequence, i.e. a constant d.c. level would be applied to the photogate. The steps involved in the convolution operation illustrated in FIG. 4a are as follows. Step 1-sense image abcd, transfer into the right CCD shift register 20, shift, and add to obtain $a$. Step 2-sense image abcd, transfer into the right CCD shift register 20, shift and add to obtain $b + a$. Step 3-sense image abcd, transfer into the left CCD shift register 10, shift and add to obtain $\overline{a} + b + c$ (where overbar denotes negation). Step 4-sense image abcd, transfer into the right shift register 20, shift and add to obtain $d + c + \overline{b} + a$. Step 5-shift and add from both CCD registers 10 and 20 to obtain $d + \overline{c} + b$. Step 6-shift and add from both CCD registers to obtain $\overline{d} + c$. Step 7-shift and add from both CCD registers to obtain $d$. To correlate, the transfer gates are manipulated in the time reverse order, i.e. for the sequence 1, 1, −1, 1 the correlation operation would utilize the sequence 1, −1, 1, 1. As is illustrated in FIG. 4b, the same steps are followed in order to convolve the same image abcd with the digital pattern 1, ½, −¼, and ¾. In order to provide the fractions weighting sequence, the photogate would remain open to accumulate charges for a period corresponding to the desired fraction. The relative output $e_0(t)$ versus time for the operation illustrated in FIG. 4b is plotted in FIG. 6 and the timing relationship between the clock phase pulses $\phi_1$ and $\phi_2$, the photogate pulses and the transfer gate pulses is illustrated in FIG. 7.

Figure 8:
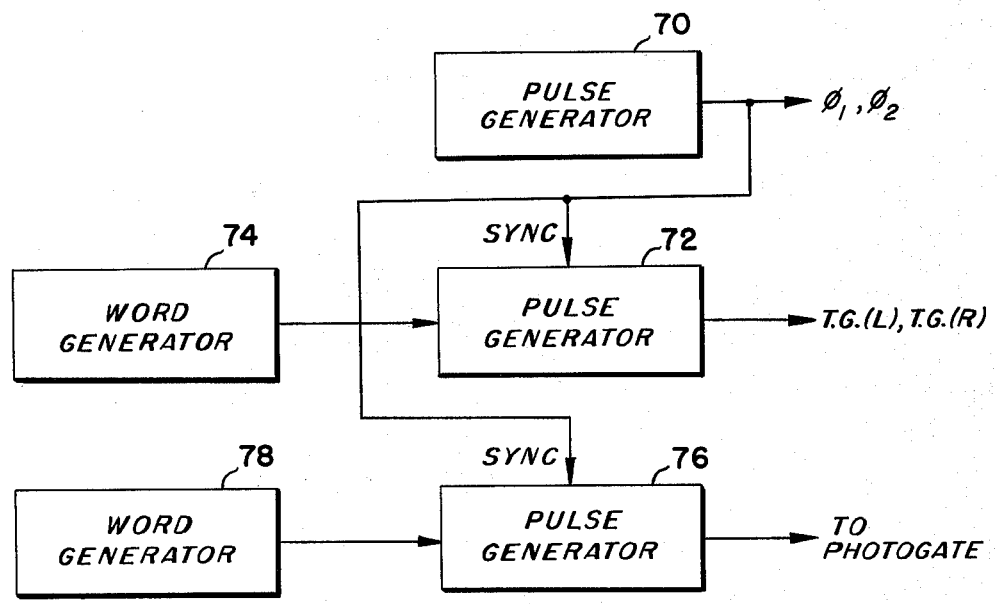
FIG. 8 is a network diagram of a suitable timing generator for producing the clock pulse, transfer gate and photogate timing pulses.

The clock pulses which control the transfer of charges into both CCD shift registers are generated by the network illustrated schematically in FIG. 8. Pulse generator 70 provides the desired clock at its output to gate the phases of the CCD shift registers at a predetermined clock frequency. The clock would also be inputted to the synchronization input of a second pulse generator 72. The function which is to be convolved with the image signal is obtained from word generator 74 which may comprise, for example, the Systron Donner Computer Data Pulse 220 Data Generator. For dealing with a sequence consisting of 1's the photogate would be connected to a d.c. source for maintaining the gate open (not shown). For implementing a sequence including fractions, a third pulse generator 76 receives the clock signal from 70 at its synchronization input. The desired fractions are obtained from word generator 78, which may be of the same type as 74. Pulse generators 70, 72 and 76 may comprise, for example, Hewlett Packard HP8012A or HP8013A pulse generators. Other means such as logic circuitry could also be utilized to provide the required timing pulses. Thus any data sequence can be generated and directed to either transfer gate 40 or 41 in order to calculate the convolution/correlation product of the two functions. Pulse generator 70 could also, if desired, include at its output a reset gate output to reset the potential at the output diodes of the CCD registers to reduce noise uncertainty. The pulses from such output would, of course, occur just prior to the information readout of the output gates of the CCD registers.

A new optical sensor combining in a single structure, a photo sensitive silicon CCD, the functions of image sensing, spacial to temporal multiplexing and convolution has thus been disclosed. By means of the present technique the "image smearing" which is a limitation in the application of CCD's as imagers is translated into an advantage which may be used in the signal processing of optical images.

Obviously many modifications and variations of the present invention are possible in the light of the above teachings. For instance, although one, two and three phase CCD shift registers have been disclosed and discussed, four phase CCD registers could also be used. Moreover, the left and right CCD input gates (FIG. 2) could be used to furnish an electrical input as opposed to the optical input from the photogate array. It is therefore to be understood that within the scope of the appended claims the invention may be practiced otherwise than as specifically described.

What is claimed is:

1. An apparatus for image sensing and mathematical transformation comprising:
    an array of optical sensors for sensing an image and storing a series of charge signals representative of said image;
    first and second CCD shift registers, each said CCD shift register comprising a plurality of bits;
    first and second distinct independently controlled transfer gate means for controlling the transfer of said charge signals from said array of optical sensors to said first and second CCD shift registers;
    a plurality of diffusion stops arranged to permit the transfer of each charge signal of said series of charge signals from each element of said array of optical sensors to one of said plurality of bits in either of said first and second CCD shift registers.

2. The apparatus of claim 1 further comprising timing means for outputting a sequence of timing pulses to said array of optical sensors.

3. The apparatus of claim 1 wherein said array of optical sensors comprises a photodiode array.

4. The apparatus of claim 1 wherein said array of optical sensors comprises photosensitive MOS capacitors.

5. The apparatus of claim 1 further comprising summing means coupled to said first and second CCD shift registers for subtracting the output of said second CCD shift register from the output of said first CCD shift register.

6. The apparatus of claim 5 further comprising timing means for outputting a sequence of timing pulses representative of a signal sequence to said first and second transfer gate means and for providing a series of clock pulses for shifting said first and second CCD shift registers, the interval between each said timing pulse determining the integration time of said optical sensors;
    whereby in response to said sequence of timing pulses and clock pulses said summing means provides an output waveform representative of the convolution of said sries of charge signals with said sequence of timing pulses.

7. The apparatus of claim 5 further comprising timing means for outputting a sequence of timing pulses representative of a signal sequence to said first and second transfer gate means and for providing a series of clock pulses for shifting said first and second CCD shift registers, the interval between each said timing pulse determining the integration time of said optical sensors;
    whereby in response to said sequence of timing pulses and clock pulses said summing means provides an output waveform representative of the correlation of said series of charg signals with said sequence of timing pulses.

8. A method of computing the convolution of first and second discrete functions comprising the steps of:
    storing a series of charge signals representative of said first function in an array of photosensors;
    transferring a first set of said charge signals to a first CCD shift register and a second set of said charge signals to a second CCD shift register in accordance with a predetermined sequence of timing pulses representative of said second function;
    shifting said first and second CCD shift registers in accordance with a predetermined series of clock pulses;
    subtracting in an adder the output of said second CCD shift register from the output of said first CCD shift register subsequent to each shifting operation;
    whereby the output of said adder is the convolution of said first and second functions.

9. A method of computing the correlation of first and second discrete functions comprising the step of:

storing a series of charge signals representative of said first function in time reversed order in an array of photosensors;

transferring a first set of said charge signals to a first CCD shift register and a second set of said charge signals to a second CCD shift register in accordance with a predetermined sequence of timing pulses representative of said second function;

shifting said first and second CCD shift registers in accordance with a predetermined series of clock pulses;

subtracting in an adder theoutput of said second CCD shift register from thhe output of said first CCD shift register subsequent to each shifting operation;

whereby the output of said adder is the correlation of said first and second functions.

* * * * *